United States Patent
Lee et al.

(10) Patent No.: US 6,529,420 B2
(45) Date of Patent: Mar. 4, 2003

(54) REDUNDANT DECODER CIRCUIT

(75) Inventors: June Lee, Seoul (KR); Young-Ho Lim, Kyunggi-do (KR)

(73) Assignee: Samsung Electronics Co., Ltd., Gyeonggi-do (KR)

(*) Notice: Subject to any disclaimer, the term of this patent is extended or adjusted under 35 U.S.C. 154(b) by 0 days.

(21) Appl. No.: 10/046,956

(22) Filed: Jan. 14, 2002

(65) Prior Publication Data

US 2002/0101771 A1 Aug. 1, 2002

(30) Foreign Application Priority Data

Jan. 15, 2001 (KR) .......................................... 2001-2210

(51) Int. Cl.[7] ................................................ G11C 7/00
(52) U.S. Cl. ................................. 365/189.07; 365/200
(58) Field of Search ............................ 365/189.07, 200, 365/201, 230.06

(56) References Cited

U.S. PATENT DOCUMENTS 5,598,373 A * 1/1997 Wada et al. ............ 365/189.07
5,604,702 A * 2/1997 Tailliet ........................ 365/200
5,815,449 A * 9/1998 Taura ........................... 365/200

* cited by examiner

*Primary Examiner*—Tan T. Nguyen
(74) *Attorney, Agent, or Firm*—Marger Johnson & McCollom, PC

(57) ABSTRACT

A redundant decoder circuit stores a repair address in electrically erasable and programmable memory, thereby allowing a redundant memory cell array to be tested before a repair operation is performed. The decoder circuit can include an address storage circuit having a plurality of electrically erasable and programmable memory cells arranged to store address data corresponding to a defective cell. A comparison circuit coupled to the address storage circuit generates an information signal responsive to the address data and an externally applied address. A redundant enable control unit can be adapted and arranged to enable and disable the redundant decoder circuit responsive to the state of an electrically erasable and programmable memory cell that indicates whether a main memory cell array has any defective cells.

9 Claims, 14 Drawing Sheets

REDUNDANT DECODER CIRCUIT

This application claims priority from Korean patent application No. 2001-2210 filed Jan. 15, 2001 in the name of Samsung Electronics Co., Ltd., which is herein incorporated by reference.

BACKGROUND OF THE INVENTION

1. Field of the Invention

The present invention relates generally to redundant decoder circuits for semiconductor memory devices, and more particularly, to redundant decoder circuits that store defective cell addresses in electrically erasable and programmable memory.

2. Description of the Related Art

The manufacturing processes for semiconductor memory devices sometimes produce devices having defective memory cells due to particles, bridges, or oxide defects. These defective memory cells reduce the production yield. One technique for improving the production yield is to repair defective cells by manufacturing the device with a redundant memory cell array in addition to a main memory cell array. If a defective cell is identified in the main memory cell array, it is replaced with a redundant memory cell from the redundant memory cell array.

To implement such a redundancy technique, the address of the defective memory cell, i.e., a repair address, must be stored on the device. FIG. 1 is a diagram showing a prior art circuit for storing a repair address. Referring to FIG. 1, a repair address storage block 1 is formed from a resistor R1 connected between power supply voltage Vcc and a node N0 for charging the node N0; pairs of fuses F0,FB0 through Fk,FBk in which one end of each fuse is connected to the node N0; pairs of transistors MN0,MNB0 through MNk, MNBk for discharging the node N0; a latch L1; and an inverter INV1.

Each of the fuse pairs F0,FB0~Fk,FBk stores one-bit of the address of a defective cell in a main memory cell array. The node N0 is high when the address stored in the fuses corresponds to external address data A0,NA0~Ak,nAk. If the addresses do not correspond, the node N0 is discharged to a low level. Thus, if the signal INFO provided through the latch L1 and the inverter INV1 is high, the external address is that of the defective cell in the main memory cell array.

The repair address storage block 1 illustrated in FIG. 1 is able to store only one repair address. A plurality of repair address storage blocks are required to store a plurality of repair addresses.

As described above, the conventional repair address storage block 1 utilizes fuse pairs F0,FBO~Fk,FBk in order to store the address of a defective cell in a main memory cell array. However, circuits using fuses require long test times. Known laser equipment used for cutting fuses is not only expensive, but also requires long test times, thereby increasing the manufacturing cost of semiconductor memory devices.

A further problem with the prior art is that it is impossible to test the redundant memory cell array for defects. This is because fuses must be laser cut in order to access the redundant memory cell array. However, once the fuses are cut, they cannot be restored, and thus, the redundant cell array cannot be tested. In addition, the laser fuses require a large topological area in the semiconductor memory device, and pads be open to be cut. Accordingly, the total layout dimension is increased.

SUMMARY OF THE INVENTION

One aspect of the present invention is a redundant decoder circuit comprising an address storage circuit having a plurality of electrically erasable and programmable memory cells arranged to store address data corresponding to a defective cell; and a comparison circuit coupled to the address storage circuit and adapted to generate an information signal responsive to the address data and an externally applied address. A redundant enable control unit can be adapted and arranged to enable and disable the redundant decoder circuit responsive to the state of an electrically erasable and programmable memory cell that indicates whether a main memory cell array has any defective cells.

Another aspect of the present invention is a memory core having main memory cells and redundant memory cells; a multiplexer coupled to the memory core and adapted to select signals from either main memory cells or redundant memory cells responsive to a selection signal; and an address storage block adapted to store an address of a defective memory cell and generate an information signal for generating the selection signal, wherein the address storage block comprises electrically erasable and programmable memory adapted to store the address of the defective memory cell.

A further aspect of the present invention is a method for accessing a memory core having main memory cell arrays and redundant memory cell arrays, the method comprising: storing address data corresponding to a defective memory cell in electrically erasable and programmable memory; comparing the address data to an externally applied address, thereby generating an information signal; and selecting either a main memory cell or redundant a memory cell responsive to the information signal.

An additional aspect of the present invention is a method for testing a memory device having main memory cells and redundant memory cells, the method comprising: programming address data corresponding to a main memory cell in an electrically erasable and programmable memory cell; accessing a redundant memory cell responsive to the address data; testing the redundant memory cell; and performing a repair operation on the memory device.

BRIEF DESCRIPTION OF THE DRAWINGS

The present invention will be described by way of exemplary embodiments, but not limitations, illustrated in the accompanying drawings in which like references denote similar elements, and in which.

DETAILED DESCRIPTION

It should be understood that this description is merely illustrative and that it should not be taken in a limiting sense. In the following detailed description, several specific details are set forth in order to provide a thorough understanding of the present invention. It will be apparent, however, to one skilled in the art that the present invention may be practiced without these specific details.

Figure 1:
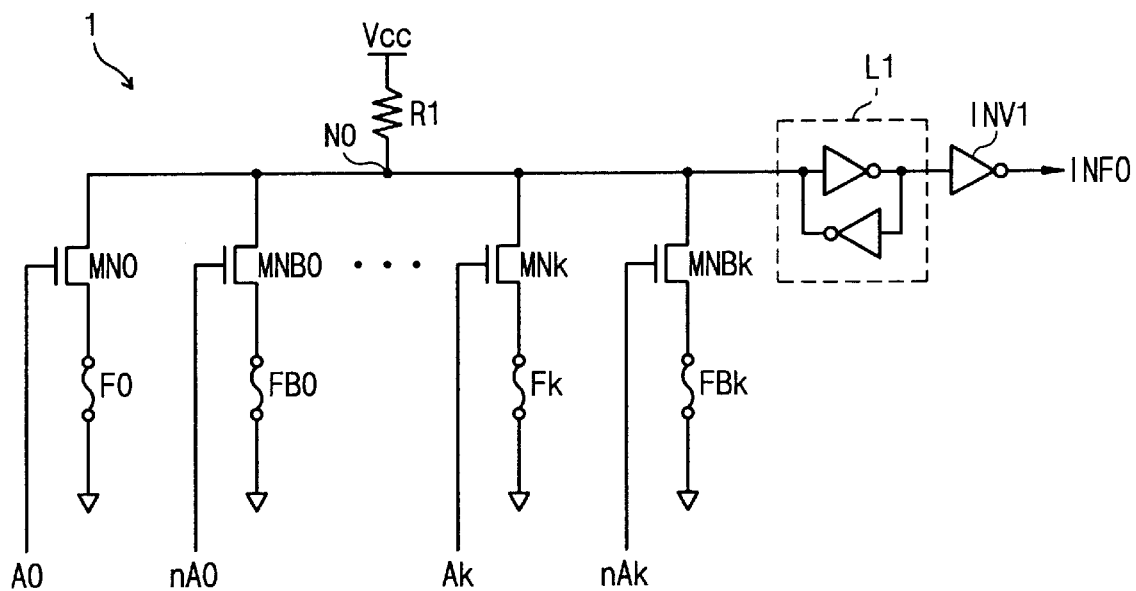
FIG. 1 is a circuit diagram showing a conventional repair address storage block.
Figure 2:
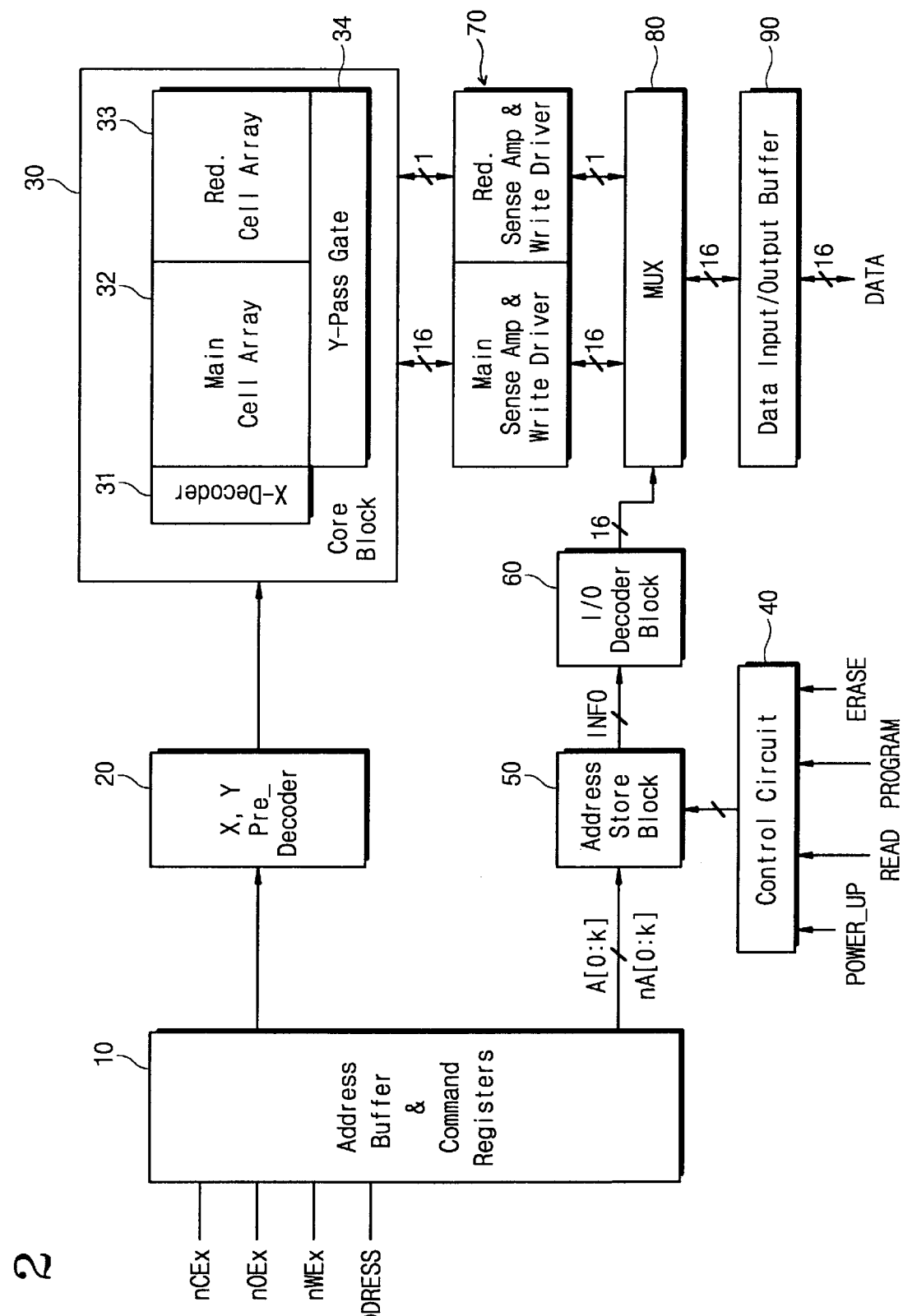
FIG. 2 is a block diagram showing a semiconductor memory device according to the present invention.

A preferred embodiment of the present invention will be described with reference to FIGS. 2 through 9. FIG. 2 shows a block diagram of a semiconductor memory device according to a preferred embodiment of the present invention. Referring to FIG. 2, a semiconductor memory device according to the present invention comprises an address buffer and command register block 10, a row and column pre-decoder block 20 (hereinafter, referred to as "an X and Y pre-decoder block"), a memory core block 30, a control circuit 40, an address storage block 50, an input/output decoder block 60, a sense amplifier and write driver block 70, a multiplexer array 80, and a data input/output buffer block 90.

The address buffer and command register block 10 receives control signals nCEx, nOEx and nWEx and an externally applied address. The X and Y pre-decoder block 20 pre-decodes an address from the address buffer and command register block 10 and provides the pre-decoded address to the memory core block 30. An X-decoder 31 and a Y-pass gate 34 in the memory core block 30 select cells in main cell array 32 and redundant cell array 33 in response to address signals from the X and Y pre-decoder block 20.

The sense amplifier and write driver block 70 includes main sense amplifiers and write drivers, and a redundant sense amplifier and write driver. The main sense amplifiers and write drivers sense and amplify data stored in selected cells in the main cell array 32 or write externally supplied data into the selected cells in the main cell array 32. The redundant sense amplifier and write driver senses and amplifies data stored in a selected cell in the redundant cell array 33 or writes externally supplied data into the selected cell of the redundant cell array 33.

The multiplexer array 80 comprises 16 multiplexers, each corresponding to one of 16 data lines that are connected to the main sense amplifiers and write drivers, respectively. During a read operation, each of the multiplexers receives a data bit from a corresponding a main sense amplifier and write driver through a corresponding data line and a data bit from the redundant sense amplifier and write driver. Each of the multiplexers selects either one of the received data bits in response to a corresponding selection signal from the input/output decoder block 60. During a write operation, each of the multiplexers receives a corresponding data bit from the input/output buffer block 90 and transfers the received data bit to the corresponding main or redundant sense amplifier and write driver in response to a corresponding selection signal from the input/output decoder block 60.

The control circuit 40 receives control signals POWER_UP, READ, PROGRAM and ERASE to generate signals needed to control the operation of the address storage block 50. The address storage block 50 stores addresses of defective cells in the main cell array 32 and compares the stored addresses with an address A[0:k] and nA[0:k] and command register block 10 under the control of the control circuit 40.

If one of the stored addresses is identical to the address A[0:k] and nA[0:k], the address storage block 50 activates an information signal INFO indicating that the address is identical to one of the stored addresses. The input/output decoder block 60 responds to the activated information signal INFO from the address storage block 50 and outputs selection signals so that one of the multiplexers in the multiplexer array 80 selects the redundant sense amplifier and write driver and the others select main sense amplifiers and write drivers.

According to the above-described configuration, when an externally applied address ADDRESS indicates a normal cell in the main cell array 32, data is written/read to/from a selected cell in the main cell array 32. On the other hand, when the externally applied address indicates a defective cell in the main cell array 32, data is written/read to/from a cell in the redundant cell array 33.

Figure 3:
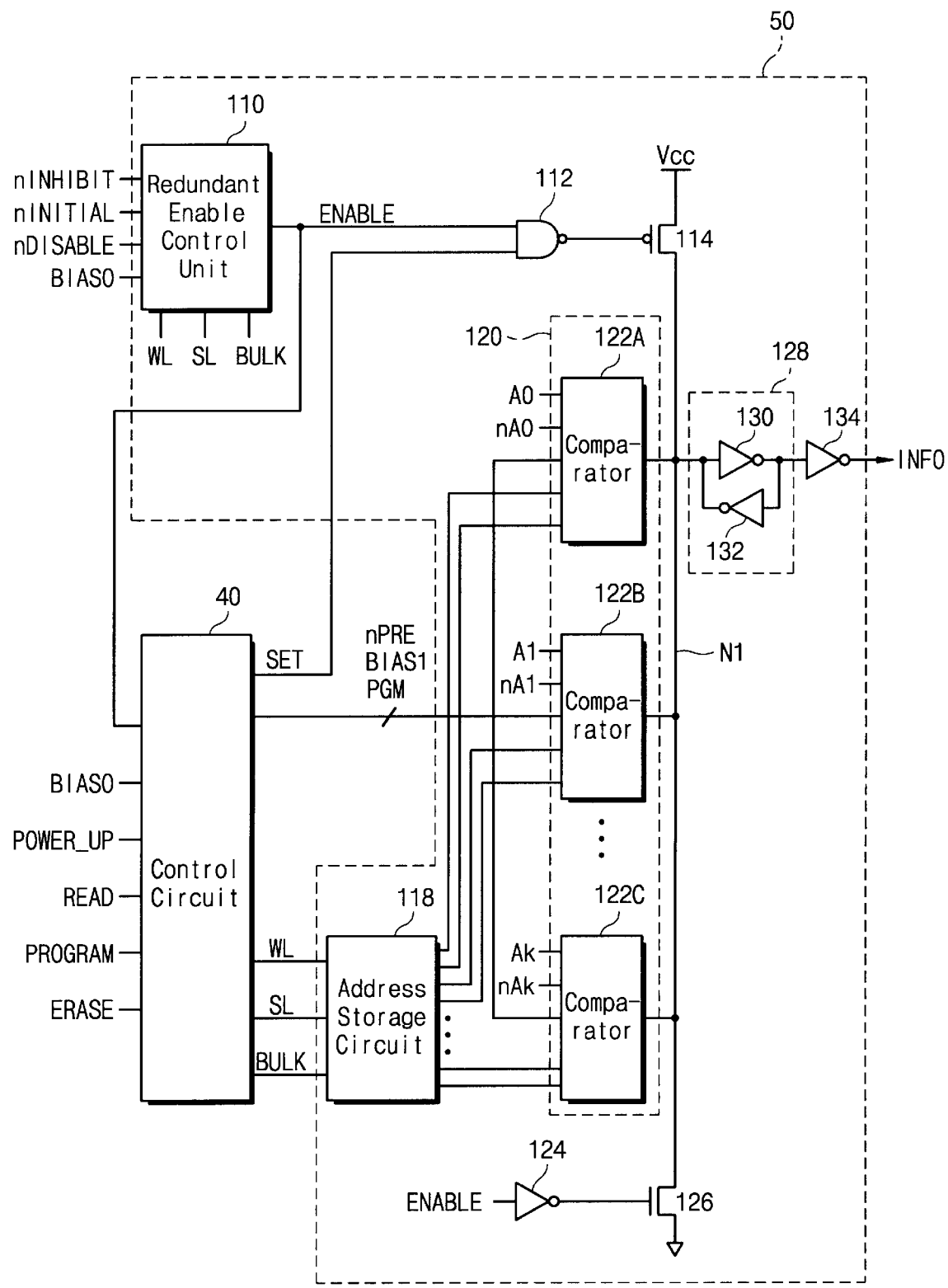
FIG. 3 is a preferred embodiment of an address storage block shown in FIG. 2.

FIG. 3 shows a preferred embodiment of the address storage block illustrated in FIG. 2. Referring to FIG. 3, the address storage block 50 includes a redundant enable control unit 110, a NAND gate 112, a P-channel metal oxide semiconductor (MOS) transistor 114, a control circuit 40, an address storage circuit 118, a comparison circuit 120, inverters 124 and 134, a N-channel MOS transistor 126, and a latch circuit 128.

The redundant enable control unit 110 stores data that indicates whether a defective cell address is stored in the address storage circuit 118, and provides an enable signal ENABLE by reading-out the stored data in response to external control signals nINHIBIT, nINITIAL, nDISABLE, and BIAS0. The NAND gate 112 performs a NAND operation by receiving the enable signal ENABLE provided from the redundant enable control unit 110 and a control signal SET provided form the control circuit 40. The PMOS transistor 114 is turned on to precharge a first node N1 to a power supply voltage Vcc when the output signal from the NAND gate 112 is low. In other words, the first node N1 is precharged when the enable signal ENABLE provided from the redundant enable control unit 110 and the control signal SET provided from the control circuit 40 are high. The latch circuit 128 latches the voltage level from the first node N1, and the inverter 134 inverts this signal to generate the signal INFO. The signal INFO from the inverter 134 is provided to the input/output decoder block 60 in FIG. 2. For ease of illustration, the address storage block 50 shown in FIG. 3 only includes circuitry that generates a single INFO signal. Although a workable circuit can be constructed with such an arrangement, a more typical embodiment would preferably include more such circuitry arranged to generate multiple INFO signals which are then used as an address for selecting one multiplexer in the MUX block 80 shown in FIG. 2.

The control circuit 40 generates control signals SET, nPRE, BIAS1, PGM for the address storage block 50 in response to external control signals BIAS0, POWER_UP, READ, PROGRAM, and ERASE; provides voltages for activating word line WL, source line SL, and bulk signal BULK in the address storage circuit 118 connected thereto; and outputs original address data A[0:k] and complementary data nA[0:k] of external address data ADDRESS[0:k].

Figure 4:
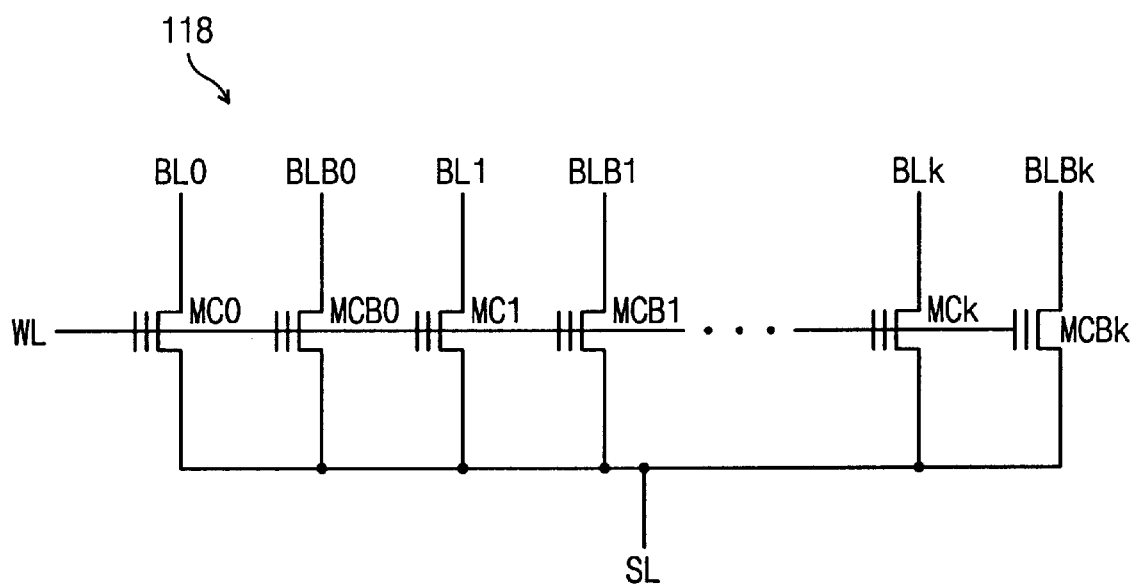
FIG. 4 is a circuit diagram showing an address storage circuit shown in FIG. 3.

The detailed circuit construction of an embodiment of the address storage circuit 118 is shown in FIG. 4. Referring to FIG. 4, the address storage circuit 118 stores a pair of complementary address data corresponding to a defective cell in the main memory cell array, and consists of k memory cell pairs MC0,MCB0 through MCk,MCBk connected to the single word line WL and to a corresponding bit line of k bit line pairs BL0,BLB0~BLk,BLBk. The memory cells is formed from erasable and programmable cells, e.g., EEPROM (electrical erasable programmable read only memory) cells. As respective sources and bulks of the EEPROM cells MC0,MCB0~MCk,MCBk are commonly connected, they are simultaneously erased in an erase mode. A word line drive circuit in the control circuit 40 generates a voltage for activating the word line WL in accordance with modes such as program, erase, and read-out.

Figure 9:
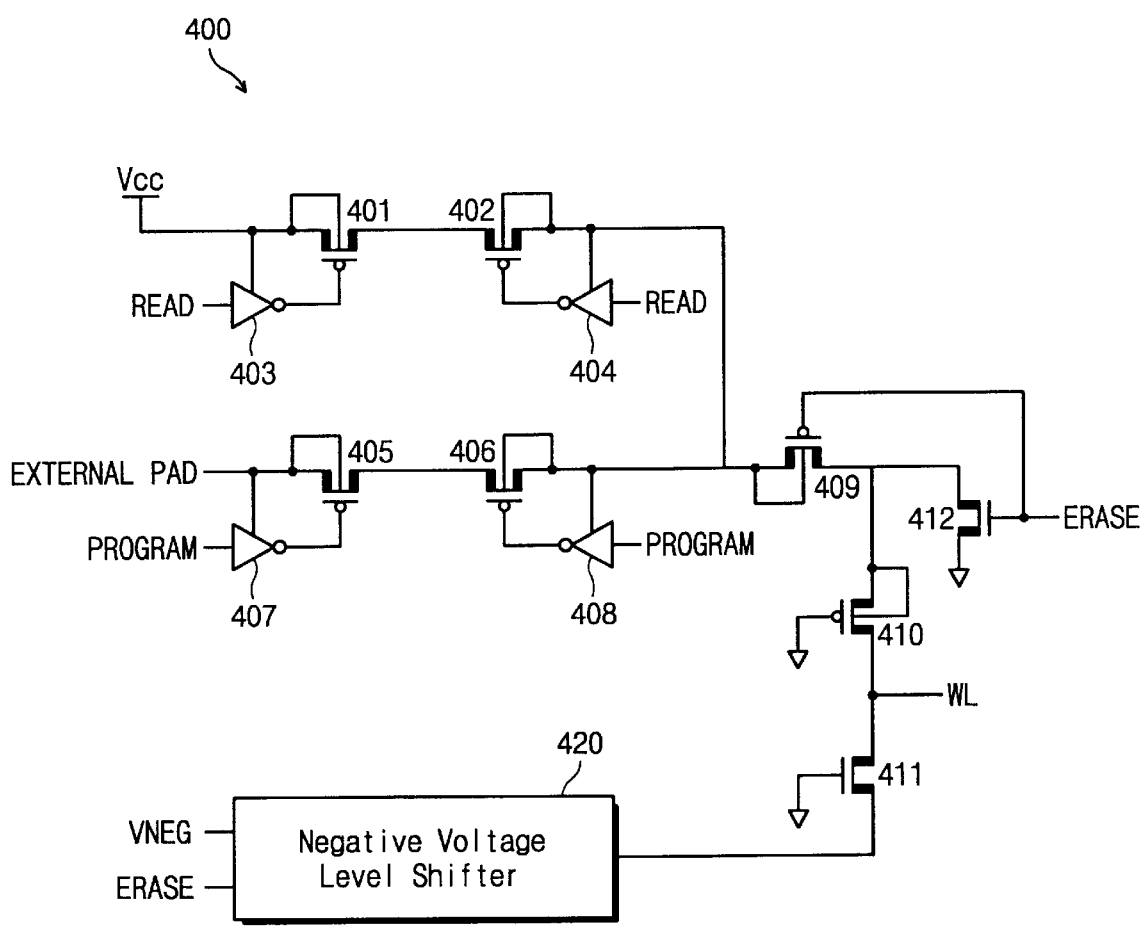
FIG. 9 is a circuit diagram showing a construction of a word line drive circuit according to an embodiment of the present invention.

The construction of an exemplary embodiment of a word line drive circuit is shown in FIG. 9. Referring to FIG. 9, the word line driver 400 includes PMOS transistors 401, 402, 405, 406, 409, and 410; NMOS transistors 411, and 412; inverters 403, 404, 407, and 408; and a negative voltage level shifter 420. The word line driver 400 provides the power supply voltage Vcc for the read-out mode, a voltage provided from the external input pad for the program mode, and negative high voltage for the erase mode to the word line WL.

Referring again to FIG. 3, the comparison circuit 120 is formed from k comparators 122A~22C which compare the stored address of the address storage circuit 118 with the external address, and selectively discharge the first node N1 according to the detected result to determine whether or not the addresses are identical to each other. The respective comparators 122A~122C corresponding to a pair of the complementary data bits among the pairs of the complementary address data are connected to the first node N1 in parallel. Each of the comparators 122A~122C has the same circuit construction and operation which will be explained with reference to FIG. 5.

Figure 5:
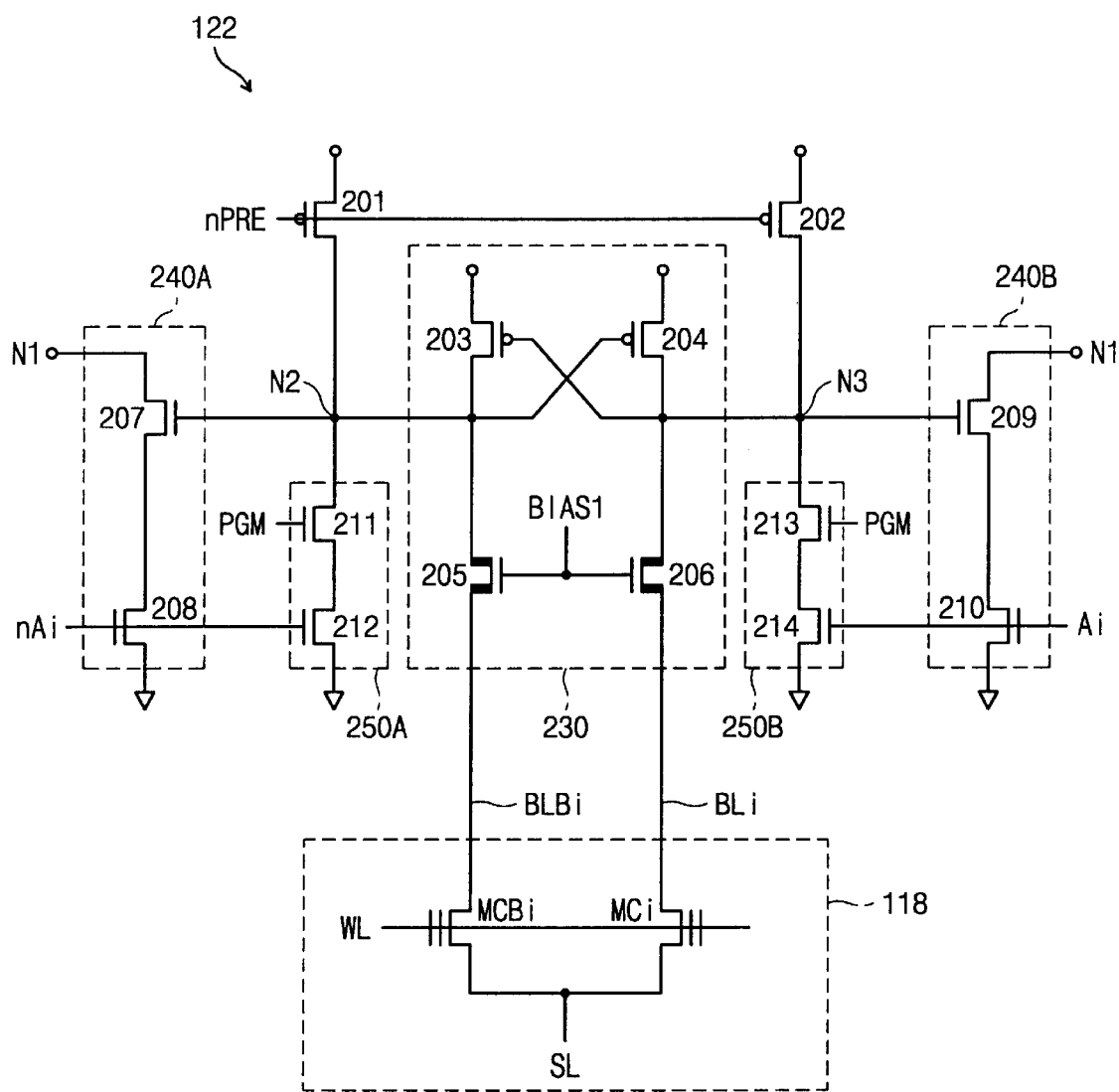
FIG. 5 a circuit diagram showing the construction of a comparator according to a preferred embodiment of the present invention.

Referring to FIG. 5, each of the comparators 122 includes precharge transistors 201 and 202, a latch circuit 230, discharge circuits 240A and 240B, and program control circuits 250A and 250B. The latch circuit 230 detects address data stored in a pair of the memory cells MCBi,MCi corresponding to a pair of the bit lines BLBi,BLi, and latches the same in second and third nodes N2 and N3, respectively. The discharge circuits 240A and 240B selectively discharge the first node N1 in accordance with whether the address data latched in the second and third nodes N2 and N3 is identical to a pair of the complementary address data Ai,nAi provided from the control circuit 40. The program control circuits 250A and 250B transfer the pair of the address data bits Ai,nAi to the second and third nodes N2 and N3, respectively, in response to the control signal PGM provided from the control circuit 40.

More specifically, each of the precharge transistors 201 and 202 is a PMOS transistor. The PMOS transistor 201 has a current path and a gate formed between the power supply voltage and the second node N2. The PMOS transistor 202 has a current path and a gate formed between the power supply voltage and the third node N3. The gates of the PMOS transistors 201 and 202 are controlled by the precharge control signal nPRE which is provided by the control circuit 40 and activated when powered up. Thus, when powered up, the second and third nodes N2 and N3 are precharged to the power supply voltage level.

The latch circuit 230 includes PMOS transistors 203 and 204, and NMOS transistors 205 and 206. The PMOS transistor 203 has a current path formed between the power supply voltage and the second node N2, and a gate coupled to the third node N3. The PMOS transistor 204 has a current path formed between the power supply voltage and the third node N3, and a gate connected to the second node N2. The NMOS transistor 205 has a current path formed between the second node N2 and the bit line BLBi, and a gate controlled by the control signal BIAS1 which is activated for the read-out mode or the program mode. The NMOS transistor 206 has a current path formed between the third node N3 and the bit line BLi, and a gate controlled by the control signal BIAS1.

The discharge circuit 240A includes an NMOS transistor 207 having a gate coupled to the second node N2, and the other NMOS transistor 208 having a gate controlled by the second address data bit nAi of the pair of address data Ai and nAi provided from the control circuit 40. The current paths of the NMOS transistors 207 and 208 are coupled in series between the first node N1 and the ground voltage.

The discharge circuit 240B includes an NMOS transistor 209 having a gate coupled to the third node N3, and another NMOS transistor 210 having a gate controlled by the first address data bit Ai which is complementary to the second address data bit nAi of the pair of address data Ai and nAi provided from the control circuit 40. The current paths of the NMOS transistors 209 and 210 are coupled between the first node N1 and the ground voltage in series.

The program control circuit 250A includes an NMOS transistor 211 having a gate controlled by the program control signal PGM provided from the control circuit 40, and another NMOS transistor 212 having a gate controlled by the second address data bit nAi. The current paths of the NMOS transistors 211 and 212 are coupled between the second node N2 and the ground voltage in series.

The program control circuit 250B includes an NMOS transistor 213 having a gate controlled by the program control signal PGM, and another NMOS transistor 214 having a gate controlled by the first address data bit Ai. The current paths of the NMOS transistors 213 and 124 are coupled between the third node N3 and the ground voltage in series.

Figure 6A:
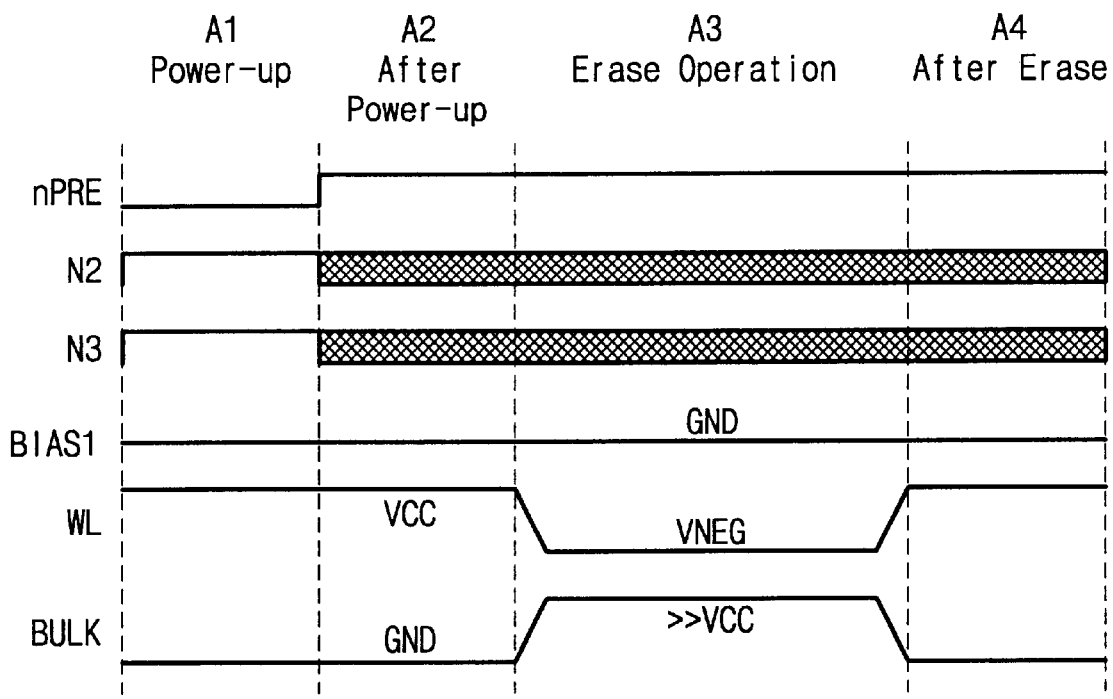
FIGS. 6A through 6E are timing diagrams showing an operation of the comparator of FIGS. 3 and 5.

An operation of the comparator 122 will be explained with reference to FIGS. 6A through 6E. FIG. 6A is a timing diagram showing an operation of the comparator when the EEPROM cells MCi,MCBi~MCk,MCBk in the address storage unit 118 are erased. Referring to FIG. 6A with FIG. 5, after powered up, when the precharge control signal nPRE transitions to the low level, the second and third nodes N2 and N3 are precharged to the power supply voltage level (period A1). During a period A3, the bit lines BLBi,BLi are floating because the NMOS transistors 205 and 206 are turned off due to the control signal BIAS1 being low. When the control circuit 40 applies negative high-voltage VNEG to the word line WL, positive high-voltage >>VCC to the bulk BULK, and the source line SL is floating, the memory cells MCBi,MCi are erased. As shown in FIG. 4, the gates of the EEPROM cells MCi,MCBi~MCk,MCBk are commonly connected to the single word line WL, and the sources thereof are connected to a single source line SL, whereby the EEPROM cells MCi,MCBi~MCk,MCBk are simultaneously erased in the erase operation.

Figure 6B:
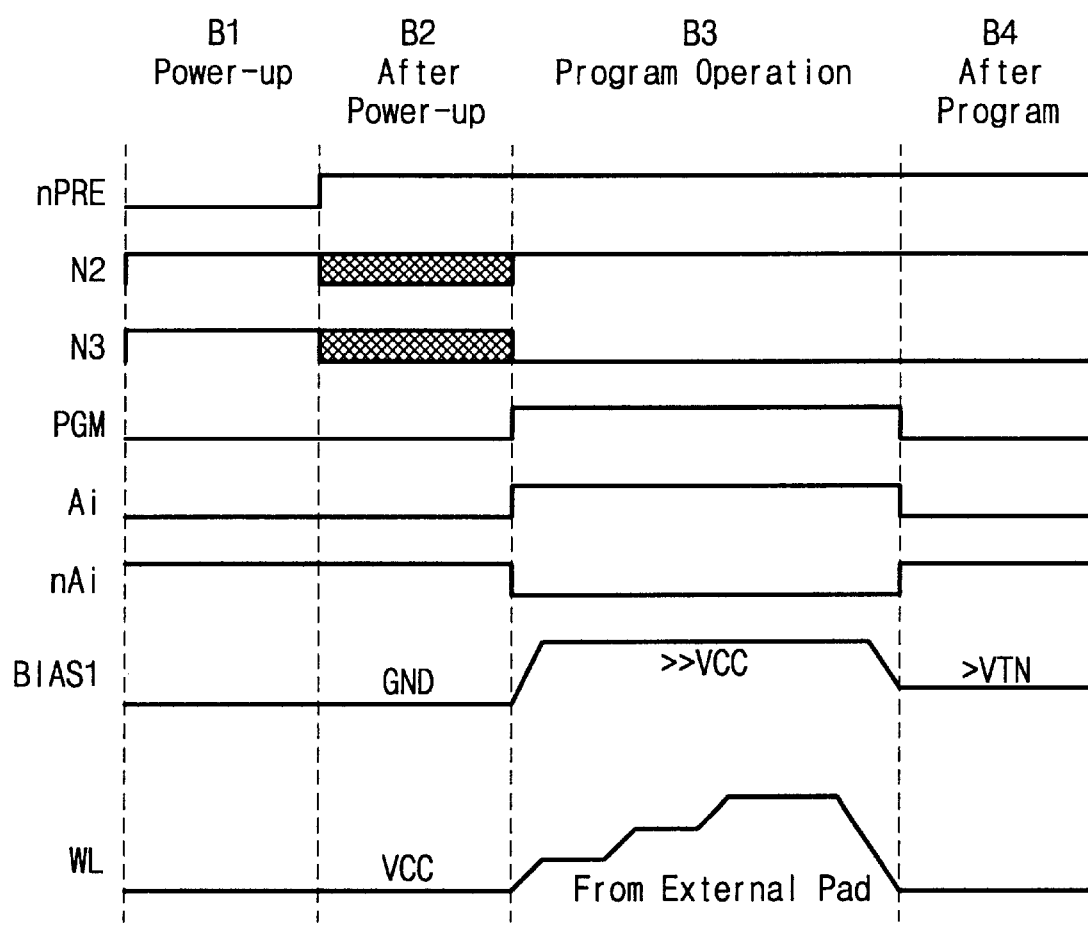

FIG. 6B is a timing diagram showing the comparator when the EEPROM cells MCi,MCBi~MCk,MCBk are programmed. Referring to FIG. 6B with FIG. 5, after powering up when the precharge control signal nPRE transitions to the low level, the second and third nodes N2 and N3 are precharged to the power supply voltage (period B1). During period B2, the nodes N2 and N3 are floating when the precharge control signal nPRE goes high. During period B3, the nodes N2 and N3 are latched high and low, respectively, when the first address data bit Ai is driven high and the second address data bit nAi is driven low by the control circuit 40 in response to the program control signal PGM. At that time, if the control circuit 40 applies a control signal BIAS1 having a higher voltage than the power supply voltage to the gates of the NMOS transistors 205 and 206, and a high voltage to the word line WL, the memory cell MCBi is programmed, while the memory cell MCi maintains the erased state.

As the EEPROM cell pair MCBi,MCi stores one-bit of the address data, a large current capacity is required to program a plurality of address data bits in the memory cells MC0, MCB0~MCk,MCBk. Thus, if an internal boosting circuit is used to generate the high voltage required for the programming operation, the number of memory cells that can be programmed is limited. To increase the number of cells that can be programmed, the power supply voltage is preferably used as the programming voltage in the present invention. In this case, the high-level control signal BIAS1, which has a higher voltage than the power supply voltage, is applied to the gates of the NMOS transistors 205 and 206, in order to supply the program voltage to the bit lines BLBi and BLi without a voltage-drop.

To further increase the performance, it is preferable to supply a higher voltage from outside the device for the program mode in wafer test step, relative to other operational modes. In this manner, programming time is reduced because multiple cells can be simultaneously programmed. In the program mode, a voltage provided from an external pad is employed to activate the word line WL. Thus, when multiple cells are simultaneously programmed, the level of the source line SL is not boosted by an over-program current, but maintained at the ground voltage level. Moreover, the program voltage can be properly controlled because the word line voltage can be raised step-by-step as shown in FIG. 6B.

Figure 6C:
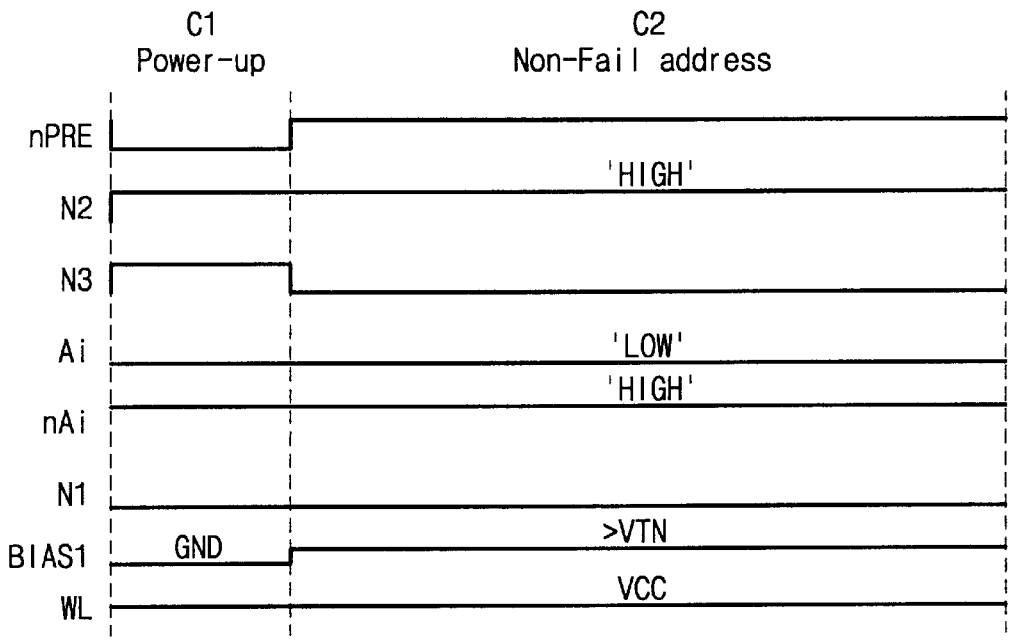
Figure 6D:
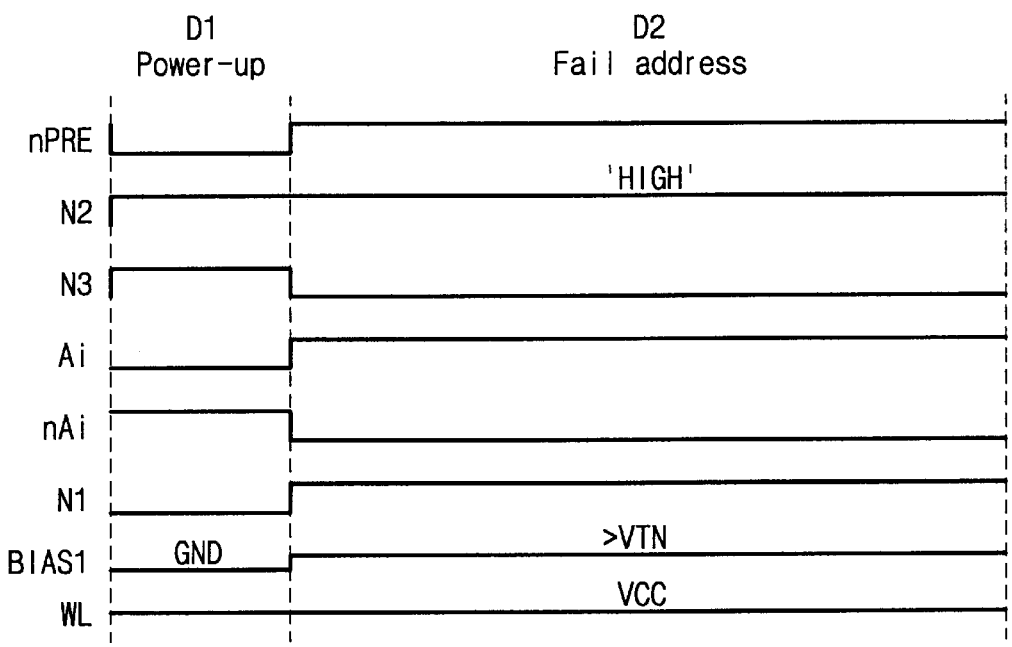

FIGS. 6C and 6D are timing diagrams showing an operation of the comparator 122 when the EEPROM cell MCBi is in the programmed (off-cell) state, and the EEPROM cell MCi is in the erased (on-cell) state. First, it is assumed that the control circuit 40 supplies address data corresponding to a normal cell in the main memory cell array, i.e., the address data bit nAi is high, while the address data bit Ai is low. Referring to FIG. 6C, the second and third nodes N2 and N3 are precharged to the high level when powered up, and then the precharge control signal nPRE and the control signal BIAS1 transition to the high level. Next, nodes N2 and N3 go high and low, respectively, in accordance with the data bits stored in the corresponding EEPROM cells MCBi,MCi. As the address data bit nAi is high, and the address data bit Ai is low, the first node N1 is discharged to the low level. In that case, referring to FIG. 3, the main memory selector 18 selects a predetermined cell corresponding to the external address ADDRESS in the main memory cell array 20 because the signal INFO provided through the latch circuit 128 and the inverter 134 is low.

Next, it is assumed that the control circuit 40 supplies the address data corresponding to a defective cell in the main memory cell array, i.e., the address data bit nAi is low, while the address data bit Ai is high. Referring to FIG. 6D, when the second and third nodes N2 and N3 are latched high and low, respectively, a current path not formed between the first node N1 and the ground voltage. As a result, the first node N1 maintains the precharged state. Referring to FIG. 3, as the signal INFO provided through the latch circuit 128 and the inverter 123 are high, the redundant memory selector 14 selects a predetermined cell in the redundant memory cell array 16. The input/output decoder block 60 outputs selection signals so that one of multiplexers in the multiplexer array 80 reads/writes data from/to the redundant cell array 33.

Figure 6E:
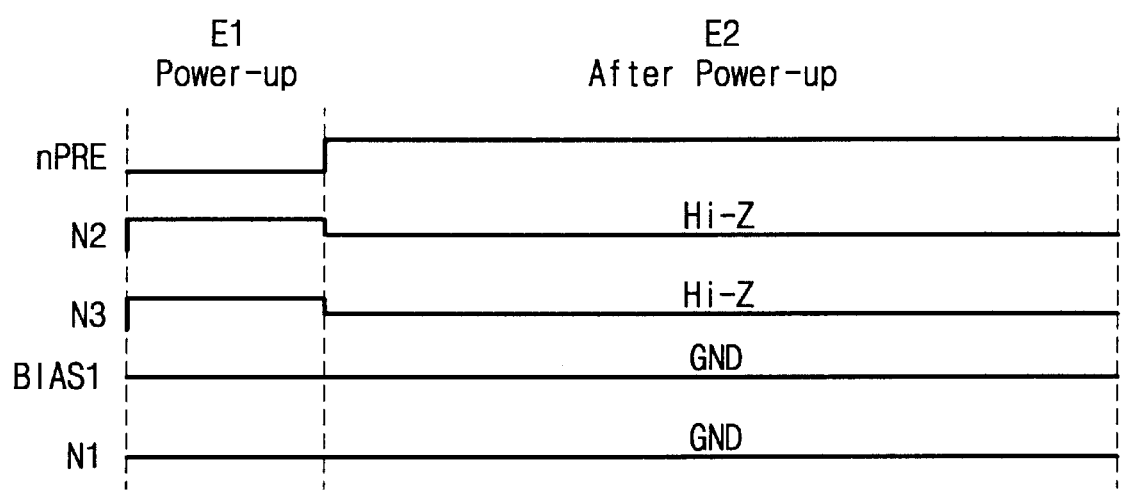

FIG. 6E is a timing diagram showing an operation when the redundant decoder circuit is not enabled by the redundant enable control unit 110. If the enable signal ENABLE provided by the redundant enable control unit 110 is low, the control circuit 40 generates the control signal BIAS1 at the low level, while the other control signals remain high. As a result, the nodes N2 and N3 are in the high impedance state, and the first node N1 is discharged to the low level by the inverter 124 and the NMOS transistor 126. In that case, a current path is not formed between the power supply voltage and the ground voltage in the comparator 122, and thus, unnecessary current consumption is prevented in the standby state.

Figure 7:
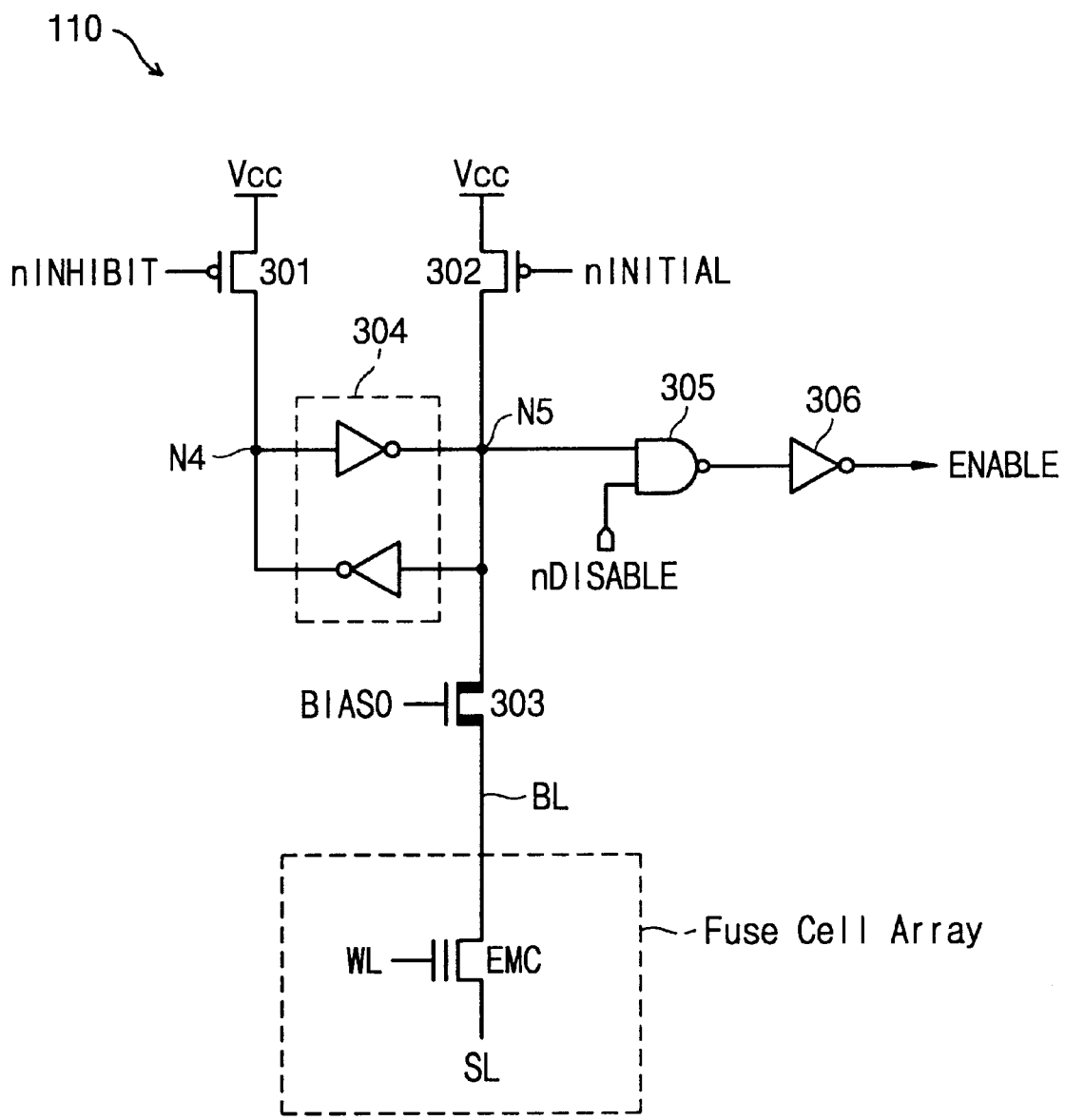
FIG. 7 is circuit diagram showing the construction of a redundant enable control unit according to referred embodiment of the present invention.

FIG. 7 shows the construction of an embodiment of the redundant enable control unit 110. Referring to FIG. 7, the redundant enable control unit 110 includes PMOS transistors 310, and 302, an EEPROM cell EMC, a NMOS transistor 303, a latch circuit 304, a NAND gate 305, and an inverter 306. The PMOS transistor 301 has a current path formed between the power supply voltage and a fourth node N4, and a gate controlled by the control signal nINHIBIT. The other PMOS transistor 302 has a current path formed between the power supply voltage and a fifth node N5, and a gate controlled by the control signal nINHIBIT. The EEPROM cell EMC stores data that indicates whether the main memory cell array has a defective cell. The NMOS transistor 303 selectively connects a bit line BL connected to the drain of the EEPROM cell EMC to the fifth node N5 in response to the control signal BIAS0. The latch circuit 304 consists of two inverters and latches the data stored in the EEPROM cell EMC in the fourth and fifth nodes N4 and N5 by read-out. The latched data in the fifth node N5 is provided through the NAND gate 305 and the inverter 306 as the enable signal ENABLE, in response to the control signal nDISABLE.

Figure 8A:
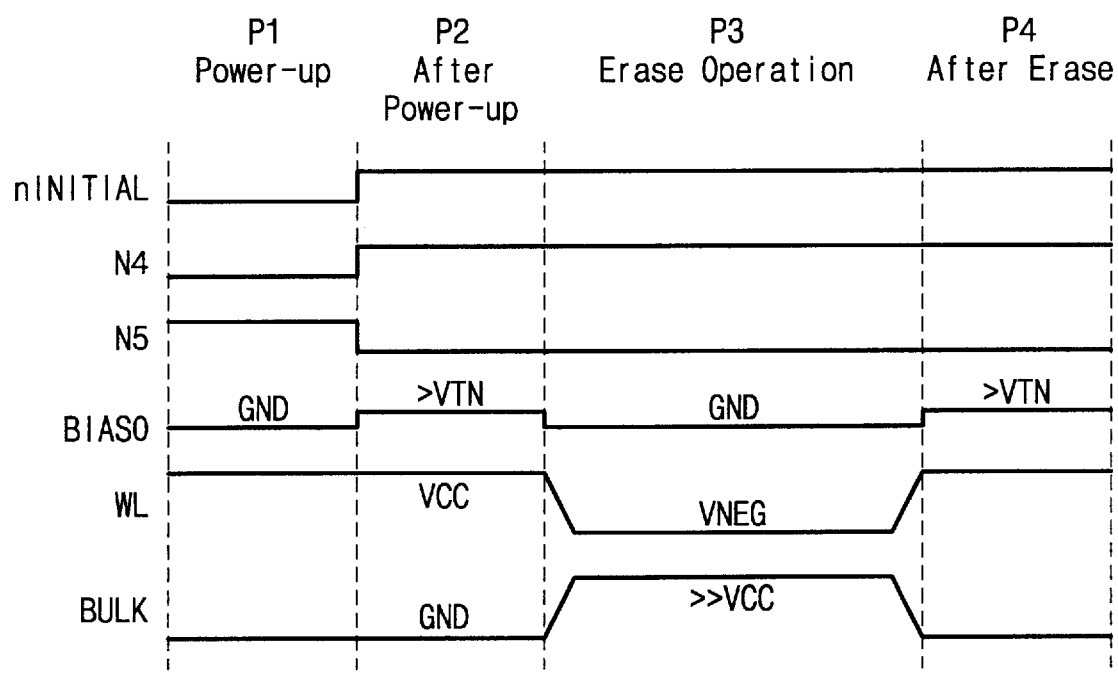
FIGS. 8A through 8D are timing diagrams showing an operation of the redundant enable control unit.

An operation of the redundant enable control unit 110 will be explained with reference to FIGS. 8A through 8D. FIG. 8A is timing diagram of input/output signals when the memory cell EMC is erased. Referring to FIG. 8A with FIG. 3, the control signals nINHIBIT and nINITIAL provided to the gates of the PMOS transistors 301 and 302 go high when powered up from the outside. Next, the control signal BIAS0 is maintained at the low level to cause the bit line BL to float, and the negative high-voltage VNEG is applied to the word line WL. A voltage higher than the power supply voltage VCC is applied to the bulk BULK. As a result, the memory cell EMC is erased.

Figure 8B:
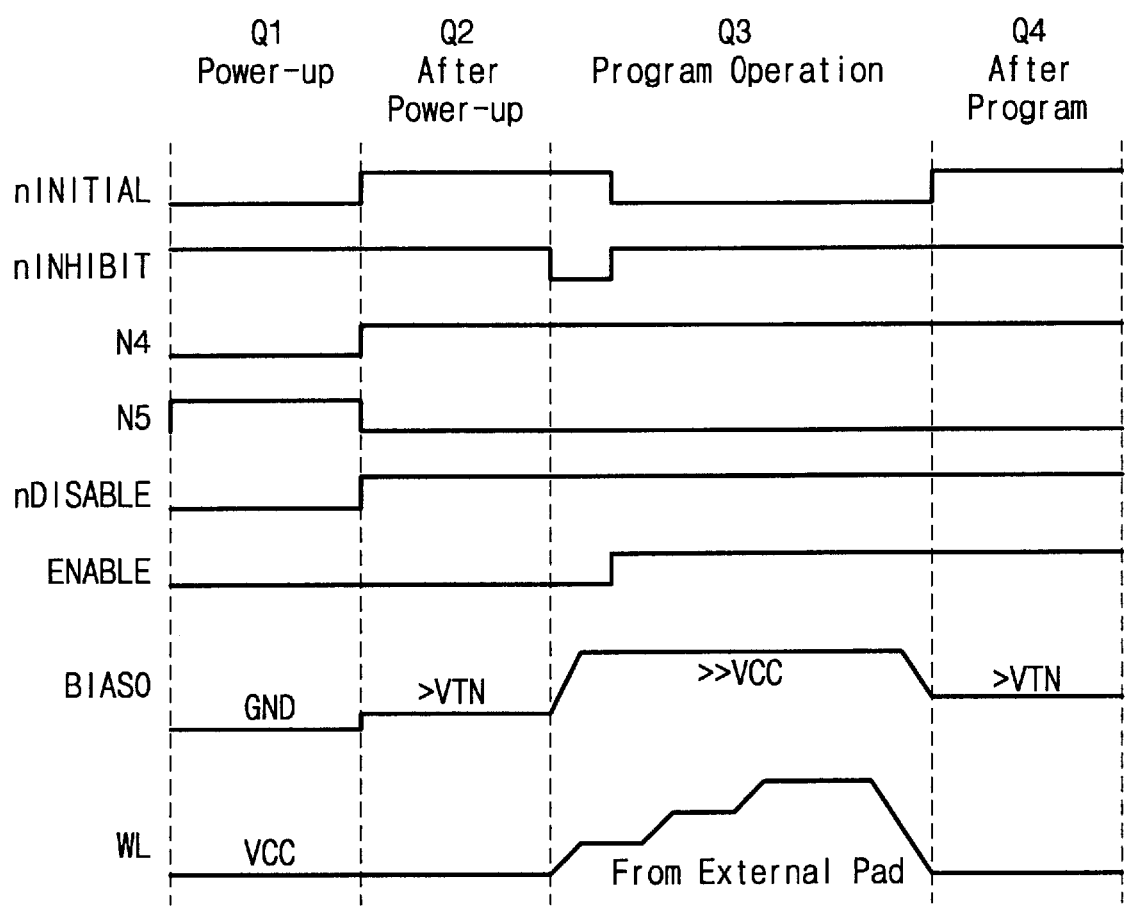

FIG. 8B is a timing diagram of the input/output signals when the EEPROM cell EMC is programmed. When the power supply voltage is applied, the control signal nINITIAL goes low (period Q1). Thus, the PMOS transistor 301 is turned on, and node N4 is precharged to the power supply voltage level. The enable signal ENABLE goes low when the control signal nDISABLE goes low. When a predetermined time has been passed after the power-up, the control signal nINITIAL goes high. The control signal BIAS0 goes to voltage level that is higher than a threshold voltage VTN of the NMOS transistor 303 so that the node N5 either goes low or is maintained at the high level in accordance with the stored data in the EEPROM cell EMC. Here, it is assumed that the EEPROM cell EMC employed in this embodiment is an erased cell. Therefore, node N5 is discharged to the low level in period Q2. If the EEPROM cell EMC is a programmed cell, the node N5 remains high. The voltage level of node N5 is latched by the latch circuit 304.

In period Q3, a programming operation for the EEPROM cell EMC is performed. The control signal nINHIBIT transitions to low level prior to the control signal nINITIAL, thereby it prevents unselected cells from programming by changing the level of the node N5 to low level in unselected redundant enable unit where the node N5 is latched to high level. Then, when the control signal nINITIAL transitions to low level, the EEPROM cells MCO,MCB0~MCk,MCBk in the address control circuit 118 are also programmed. During the period Q3, the control signal BIAS0 higher than the power supply voltage is applied to the gate of the NMOS transistor 303, and an external high-voltage is applied to the word line WL, in order to the program operation is performed without a program voltage-drop.

Figure 8C:
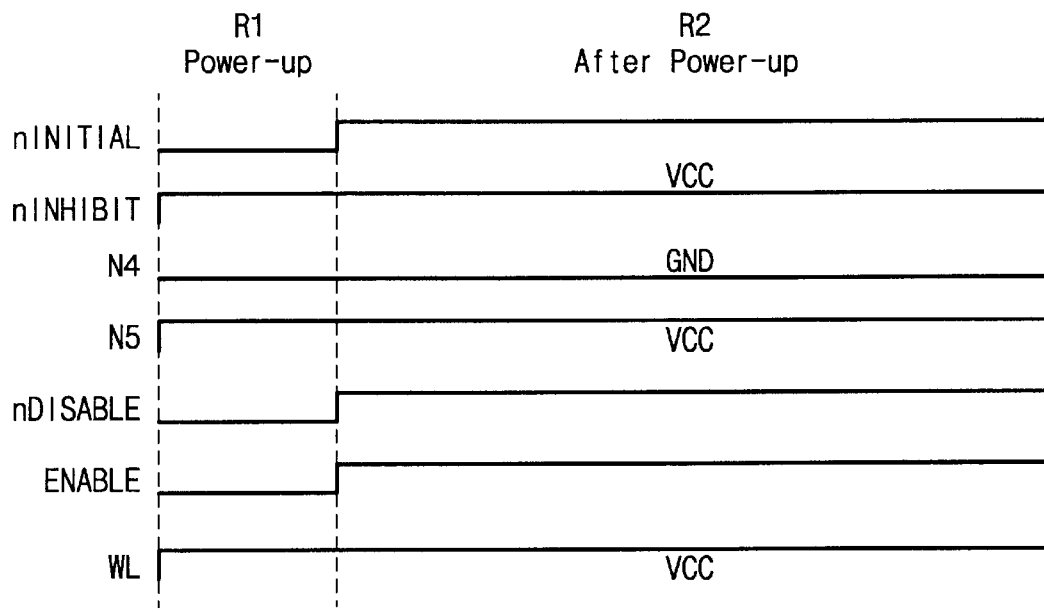

FIG. 8C is a timing diagram showing the input/output signals of the redundant enable control unit 110 when the powered up with the EEPROM cell EMC in the programmed state. When the control signal nINITIAL transitions from low to high, the precharged node N5 is maintained at the high level. Thus, the enable signal ENABLE goes high. In that case, the address storage block 50 is enabled.

Figure 8D:
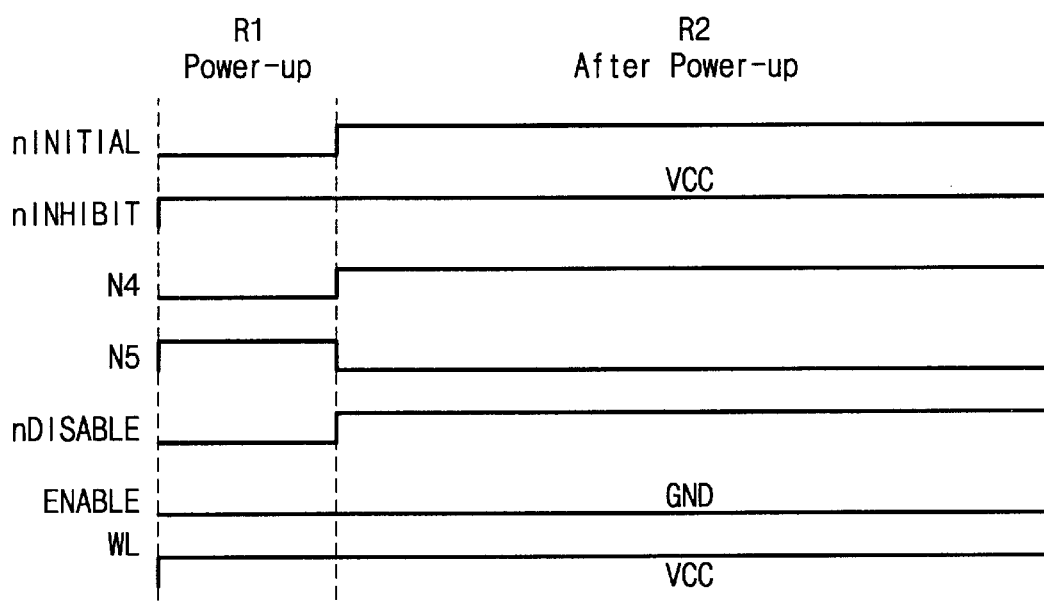

FIG. 8D is a timing diagram showing the input/output signals of the redundant enable control unit 110 when powered up with the EEPROM cell EMC in the erased state. When the control signal nINITIAL transitions from low to high, the precharged node N5 is discharged. Thus, the enable signal ENABLE goes low. In that case, the address storage block 50 is disabled.

In this embodiment, the address storage circuit 118 stores one repair address related to a defective cell in the main cell array 32. Plural address storage block 50 shown in FIG. 3 can be used to repair plural defective cells in the main cell array 32. If plural address storage blocks 50 are utilized in the memory device, the input/output decoder block 60 outputs selection signals such that a multiplexer corresponding to an activated one of output signals from the address storage blocks writes/reads data to/from the redundant cell array.

In accordance with the present invention, a test of a redundant cell array can be performed before a repair operation by storing a cell address in the electrically erasable and programmable memory cell. This can be accomplished by programming address data corresponding to a main memory cell in the electrically erasable and programmable memory cell, accessing a redundant memory cell responsive to the address data, testing the redundant memory cell, and performing a repair operation on the memory device by reprogramming the electrically erasable and programmable memory cell.

Further, if an external voltage is used for driving the word line when the electrically erasable and programmable cells are programmed, program disturbance caused by a rising voltage on a source line can be improved.

Numerous modifications and variations of the present invention are possible in light of the above teachings. Accordingly, such changes and modifications are considered to fall within the scope of the following claims.

We claim:

1. A redundant decoder circuit comprising:
a memory cell array having a plurality of electrically erasable and programmable memory cells, each connected to a single word line and a corresponding one of a plurality of bit lines, for storing pairs of complementary address data corresponding to defective cell in a main memory cell array;
a word line driver for generating signals for activating the word line in read-out, erase, and program modes;
a precharge circuit for precharging a first node;
an output circuit for generating an information signal by latching a voltage level of the first node; and
comparison units coupled in parallel to the first node, wherein each comparison unit corresponds to a pair of the complementary address data;
wherein each comparison unit comprises:
a latch circuit for sensing the address data bits stored in the electrically erasable and programmable memory cells and latching the same in a second node and a third node;
a discharge circuit for selectively discharging the first node responsive to the latched address data bits in the second and third nodes and a pair of externally applied complementary address data bits; and
a program control circuit for transferring the pair of external address data bits to the second and third nodes in response to a first control signal.

2. The circuit of claim 1, wherein the memory cells are electrically erasable programmable read only memory (EEPROM) cells.

3. The circuit of claim 1, further comprising a sub precharge circuit for precharging the second and third nodes in response to a second control signal which is activated when the circuit is powered up.

4. The circuit of claim 3, wherein the sub precharge circuit comprises:
a first transistor having a current path coupled between a power supply voltage and the second node, and a gate controlled by the second control signal; and
a second transistor having a current path coupled between the power supply voltage and the third node, and a gate controlled by the second control signal.

5. The circuit of claim 1, wherein each latch circuit comprises:
a third transistor having a current path coupled between a power supply voltage and the second node, and a gate connected to the third node;
a fourth transistor having a current path coupled between the power supply voltage and the third node, and a gate connected to the second node;
a fifth transistor having a current path coupled between the second node and a first bit line of the pair of the bit lines, and a gate controlled by a third control signal which is activated during a read-out mode or a program mode; and
a sixth transistor having a current path coupled between the third node and a second bit line of the pair of the bit lines, and a gate controlled by the third control signal.

6. The circuit of claim 1, wherein the discharge circuit comprises:
a seventh transistor having a gate coupled to the second node;
an eighth transistor having a gate controlled by a bit corresponding to a first address data of a pair of external address data;
a ninth transistor having a gate connected to the third node; and
a tenth transistor having a gate controlled by a bit corresponding to a second address data complementary to the first address data of the pair of the external address data;
wherein the seventh and eighth transistors have current paths that are coupled in series between the first node and ground voltage, and the ninth and tenth transistors have current paths that are coupled between the first node and the ground voltage in series.

7. The circuit of claim 6, wherein each program control circuit comprises:

an eleventh transistor having a gate controlled by the first control signal;

a twelfth transistor having a gate controlled the bit corresponding to the first address data;

a thirteenth transistor having a gate controlled by the first control signal; and a fourteenth transistor having a gate controlled by the bit corresponding to the second address data;

wherein the eleventh and twelfth transistors have current paths that are coupled between the second node and the ground voltage in series, and the thirteenth and fourteenth transistors have current paths that are coupled between the third node and the ground voltage in series.

8. The circuit of claim 1, wherein the precharge circuit comprises:

an enable control unit for generating an enable signal to enable the redundant decoder circuit; and a transistor having a current path coupled between the power supply voltage and the first node, and a gate controlled by the enable signal.

9. The circuit of claim 8, wherein the enable control unit comprises:

an enable memory cell for storing data indicating whether the redundant decoder circuit is enabled or not;

a fifteenth transistor having a current path coupled between the power supply voltage and a fourth node, and a gate controlled by a fourth control signal;

a sixteenth transistor having a current path coupled between the power supply voltage and a fifth node, and a gate controlled by a fifth control signal;

an enable data latch circuit for latching the data stored in the enable memory cell in the fifth node; and an enable signal output circuit for providing the latched data of the fifth node as the enable signal in response to the sixth control signal.

* * * * *

UNITED STATES PATENT AND TRADEMARK OFFICE
CERTIFICATE OF CORRECTION

PATENT NO.    : 6,529,420 B2
DATED         : March 4, 2003
INVENTOR(S)   : Lee et al.

Page 1 of 1

It is certified that error appears in the above-identified patent and that said Letters Patent is hereby corrected as shown below:

Column 1,
Line 41, "A0,NA0" should read -- A0,nA0 --.

Column 2,
Line 64, "according to referred" should read -- according to a preferred --.

Column 3,
Line 66, "nA[0:k] and command register" should read -- nA[0:k] from the address buffer and command register --.

Column 5,
Line 21, "122A~22C" should read -- 122A~122C --.

Signed and Sealed this

Seventh Day of October, 2003

JAMES E. ROGAN
*Director of the United States Patent and Trademark Office*